United States Patent [19]

Sagara et al.

[11] Patent Number: 4,829,361
[45] Date of Patent: May 9, 1989

[54] SEMICONDUCTOR DEVICE

[75] Inventors: Kazuhiko Sagara; Tohru Nakamura; Kazuo Nakazato; Tokuo Kure; Kiyoji Ikeda; Noriyuki Homma, all of Tokyo, Japan

[73] Assignee: Hitachi, Ltd., Tokyo, Japan

[21] Appl. No.: 120,921

[22] Filed: Nov. 16, 1987

Related U.S. Application Data

[63] Continuation of Ser. No. 789,776, Oct. 21, 1985, abandoned.

[30] Foreign Application Priority Data

Oct. 22, 1984 [JP] Japan ................... 59-220410

[51] Int. Cl.$^4$ ............................................. H01H 27/04
[52] U.S. Cl. ............................................. 357/50; 357/45; 357/48; 357/49; 357/52; 357/55; 357/59
[58] Field of Search ................. 357/44, 45, 48, 49, 357/50, 51, 52, 55, 59

[56] References Cited

U.S. PATENT DOCUMENTS 4,476,480 10/1984 Fuse ........................... 357/44
4,573,064 2/1986 McLevige et al. ............ 357/51

Primary Examiner—Edward J. Wojciechowicz
Attorney, Agent, or Firm—Antonelli, Terry & Wands

[57] ABSTRACT

A semiconductor device wherein a layer doped with impurities is provided between a buried layer and an epitaxial layer, said layer doped with impurities having a conductivity of the type opposite to that of said buried layer and said epitaxial layer, a reversely biasing voltage is applied across the buried layer and the layer doped with impurities, and side surfaces of the epitaxial layer are surrounded by an insulator.

This helps effectively prevent the element formed in the epitaxial layer from being affected by α-particles and greatly improve reliability of the semiconductor device.

39 Claims, 2 Drawing Sheets

SEMICONDUCTOR DEVICE

This application is a Continuation application of application Ser. No. 789,776, filed Oct. 21, 1985. Now abandoned.

BACKGROUND OF THE INVENTION

The present invention relates to a semiconductor device, and more specifically to a semiconductor device having increased immunity against α-particles and external noise.

In a conventional semiconductor device as disclosed, for example, in Japanese Patent Laid-Open No. 1556/1981, a p-type substrate is provided with a buried layer which is doped with large amounts of n-type impurities, an epitaxial layer is grown thereon, and a transistor is formed in the epitaxial layer. With the thus formed transistor, however, as the α-particles infiltrate from the external side to generate electron and hole pairs in the p-type substrate, the electrons are absorbed by the epitaxial layer through the buried layer and the potential undergoes a change. Therefore, the memory cell using such a transistor leaves a problem with regard to that the data tends to be easily destroyed, and it has been urged to solve this problem.

SUMMARY OF THE INVENTION

The object of the present invention is to provide a semiconductor device which is free from the above-mentioned problem inherent in the conventional art, which has increased immunity against external noise, and which is very little likely to develop soft error by α-particles.

To achieve the above object according to the present invention, a doped layer of a first type of conductivity surrounded by an insulator is interposed between a buried layer of a second type of conductivity that is formed in the surface region of a semiconductor substrate of the first type of conductivity and an epitaxial layer of the second type of conductivity that is formed on said buried layer and that is surrounded by the insulator. This helps prevent the infiltration of electrons from the substrate into the epitaxial layer of the second type of conductivity which is the active region.

In the conventional device, the electrons generated in the substrate of the first type of conductivity due to α-particles that have entered from the ceramic package into the substrate enter into the epitaxial layer of the second type of conductivity which is the active region, giving rise to the occurrence of a serious problem of so-called soft error.

According to the present invention, however, the doped layer of the first type of conductivity exists between the epitaxial layer of the second type of conductivity and the buried layer of the second type of conductivity, and both the epitaxial layer and the doped layer are surrounded by the insulator. Therefore, the electrons are effectively prevented from flowing into the epitaxial layer from the substrate.

Thus, a variety of memory devices can be formed in the epitaxial layer which is the active region, featuring very little probability of soft error by α-particles and very high reliability.

DESCRIPTION OF THE PREFERRED EMBODIMENTS

Figure 1:
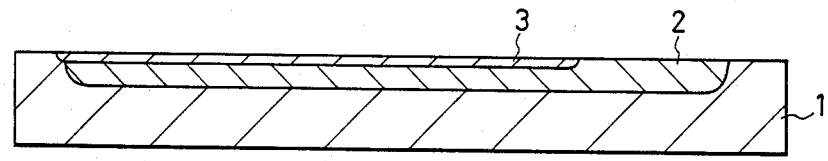
FIGS. 1, 2 and 3 are diagrams showing one example of steps for producing semiconductor devices of the present invention.
Figure 2:
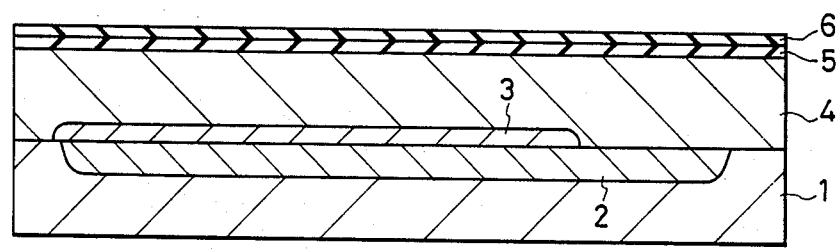
Figure 3:
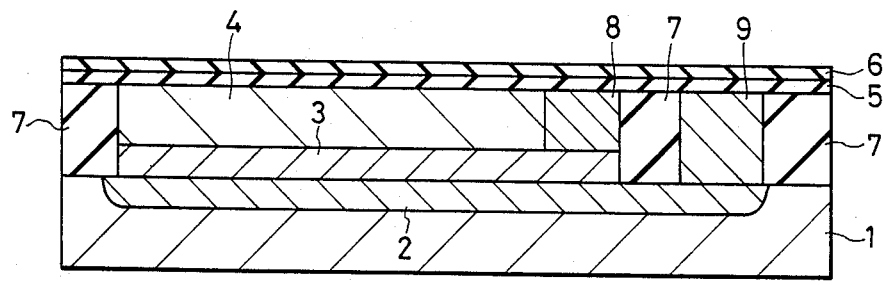

FIGS. 1, 2 and 3 are diagrams showing one example of steps for producing semiconductor devices of the present invention.

As shown in FIG. 1, first, antimony is selectively doped by the known gas diffusion technology into a desired portion in the surface region of a p-type silicon substrate 1, to form an n-type buried layer 2 of a low resistivity. Further, boron is selectively doped by the ion implantation technology to form a p-type doped layer 3.

Referring to FIG. 2, silicon is epitaxially grown by the well-known chemical vapor deposition method to form an n-type epitaxial layer 4, and a silicon dioxide film 5 and a silicon nitride film 6 are formed on the epitaxial layer 4.

Then, a silicon dioxide region 7 is formed as shown in FIG. 3 by the well-known selective oxidation method. Here, side surfaces of the p-type doped layer 3 under the active region are surrounded by the silicon dioxide region 7. Then, a p-type doped layer 8 and an n-type doped layer 9 are provided so that a potential can be applied from the substrate surface to the p-type doped layer 3 and the n-type buried layer 2, respectively.

Thereafter, any element such as bipolar transistor, diode, MOS transistor, capacitor or resistor is formed in the epitaxial layer 4 (active region) surrounded by the silicon dioxide region 7, thereby to form a semiconductor device that is very little affected by external noise or α-particles.

Figure 4:
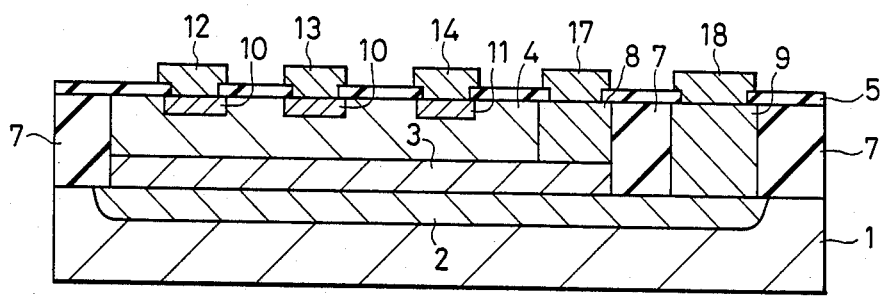
FIGS. 4, 5 and 6 are section views showing different embodiments of the present invention.

FIG. 4 is a section view of a lateral pnp-type bipolar transistor which is obtained by forming a p-type doped layer 10 and an n-type doped layer 11 in the epitaxial layer 4. In FIG. 4, symbols 12, 13, 14, 17 and 18 denote aluminum electrodes formed by a conventional method.

A reversely biasing voltage is applied across the p-type doped layer 3 and the n-type buried layer 2 via the electrodes 17, 18, and whereby a depletion layer is formed in the boundary between the p-type doped layer 3 and the n-type buried layer 2.

Therefore, even if electrons are generated by α-particles that have infiltrated into the silicon substrate 1, the passage of electrons is blocked by the electric field in the depletion layer; i.e., the electrons are effectively prevented from infiltrating into the n-type epitaxial layer 4 which is the active region.

As will be obvious from FIG. 4, furthermore, side surfaces of the n-type epitaxial layer 4 and the p-type layers 3 are surrounded by the silicon dioxide region 7. Therefore, electrons generated by the α-particles do not infiltrate into the epitaxial layer 4 through the side surfaces.

Namely, electrons heading from the substrate 1 toward the bottom surface of the epitaxial layer 4 are blocked by the electric field in the depletion layer, and electrons heading from the sides toward the epitaxial layer 4 are blocked by the silicon dioxide region 7. Therefore, the bipolar transistor formed in the epitaxial layer 4 is very little affected by the α-particles, and the semiconductor device features a very high reliability.

Figure 5:
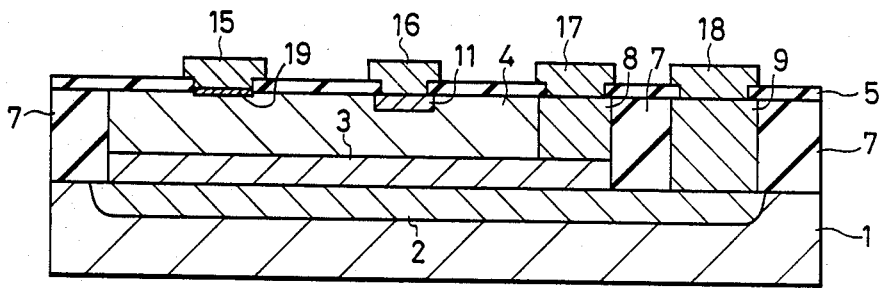

FIG. 5 illustrates another embodiment of the present invention in which a Schottky barrier diode is formed in the epitaxial layer 4.

That is, a silicide layer (platinum silicide in this embodiment) 19 and an n-type doped layer 11 having a low resistivity are formed on the surface of the epitaxial layer 4, and then aluminum electrodes 15, 16 are formed. A Schottky contact is formed between the silicide layer 19 and the epitaxial layer 4, and an ohmic contact is formed between the n-type doped layer 11 and the aluminum electrode 16. Consequently, a Schottky barrier diode is formed in the epitaxial layer 4 with one aluminum electrode 15 as an anode and another aluminum electrode 16 as a cathode.

Like the bipolar transistor of the above-mentioned embodiment, the Schottky barrier diode of this embodiment is very little affected by the α-particles and features a high reliability.

Figure 6:
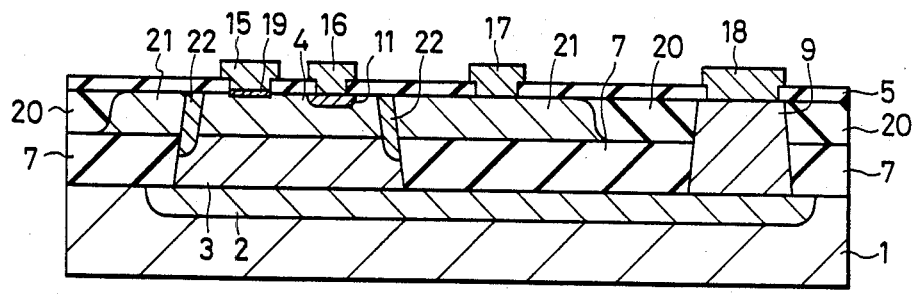

FIG. 6 shows a further embodiment in which the invention is adapted to a semiconductor device such as bipolar transistor of the type wherein an electrode is taken out from a desired side surface of the semiconductor layer such as base via polycrystalline silicon having a low resistivity.

As is obvious from FIG. 6, p-type doped regions 22 are provided by the sides of the p-type doped region 3 and the epitaxial layer 4, and polycrystalline silicon layer 21 of a low resistivity doped with boron is formed on the back side of the p-type doped regions 22 (on the side opposite to the epitaxial layer 4).

A positive potential is applied to the aluminum electrode 18 and a negative potential is applied to the aluminum electrode 17. Then, the positive potential is applied to the n-type buried layer 2 via the n-type region 9 having a low resistivity and the negative potential is applied to the p-type doped layer 3 via the polycrystalline silicon layer 21 having a low resistivity and the p-type doped region 22.

Like the aforementioned embodiments, therefore, a depletion layer is formed in the boundary between the p-type layer 3 and the n-type buried layer 2. The depletion layer effectively prevents the infiltration of electrons into the epitaxial layer 4 from the lower direction.

Further, the infiltration of electrons into the epitaxial layer 4 from the side directions is blocked by the silicon dioxide regions 7, 20 that surround the side surfaces of the epitaxial layer 4 and the p-type layer 3. Therefore, the element (Schottky barrier diode in this embodiment) formed in the epitaxial layer 4 is far less affected by the α-particles than the conventional devices.

This embodiment makes it possible to greatly reduce the area of the epitaxial layer 4 which is the active region (where elements such as transistors and diodes are formed) compared with the above-mentioned other embodiment, and is very advantageous for increasing the degree of integration.

Moreover, since the size of the p-type layer 3 can be reduced considerably, the capacity decreases relative to the n-type buried layer 2, and the element exhibits improved characteristics.

According to the present invention, as obvious from the foregoing description, fault caused by the α-particles decreases greatly which is very effective to improve characteristics of the semi-conductor device. For instance, if the present invention is adapted to a highly integrated memory LSI which employs very-high-speed bipolar transistors, there can be obtained a semiconductor device which develops very little soft error caused by α-particles and which is little affected by external noise.

A 1-kilobit bipolar memory prepared in accordance with the present invention exhibited a maximum collected charge of $4.8 \times 10^{-13}$ C (about one-fifth that of the conventional charge), $Q_{MC}$ which is reduced to 1/3.5, and $Q_{noise}$ which is reduced to 1/5. Accordingly, the error bit rate becomes $10^{-5}$/sec (compared with the conventional rate of $10^{-1}$/sec), and the immunity against the α-particles is improved by about ten thousand times compared with the existing memory cells.

In the above embodiments, a bipolar transistor or a Schottky diode was formed in the n-type layer 4. According to the present invention, however, what can be formed in the n-type layer 4 is not necessarily limited to the bipolar transistor or the Schottky diode. For instance, there can be formed one or two or more elements such as MOS transistors, capacitors or resistors. It need not be pointed out that there can be obtained a variety of memories or circuits by forming a plurality of such elements.

Further, the thickness and impurity concentration of the doped layer 3 having the first type of conductivity are determined from the kind of the semiconductor device to be formed. Favorable effects can be obtained if the thickness is greater than about 0.4 μm and the impurity concentration is greater than about $1 \times 10^{17}$ cm$^{-3}$.

In the above-mentioned embodiments, furthermore, side surfaces of both the n-type epitaxial layer 4 and the p-type layer 3 are surrounded by an insulator. The most desirable results are obtained if the two layers are surrounded by the insulator. Even when side surfaces of the n-type epitaxial layer 4 only are surrounded by the insulator without surrounding side surfaces of the p-type layer 3, the device still exhibits improved results compared with those of the conventional semiconductor devices.

What is claimed is:

1. A semiconductor device, including at least one semiconductor element formed in an active region constituted by a semiconductor epitaxial layer, comprising:
   a semiconductor substrate of a first type of conductivity;
   a buried layer which is formed in a surface region of said semiconductor substrate of a first type of conductivity, said buried layer having a second type of conductivity opposite to the first type of conductivity;
   an epitaxial layer of the second type of conductivity stacked on said buried layer, said epitaxial layer having sides extending from a bottom surface closest to the buried layer to an upper surface of the epitaxial layer, the active region, in which at least one semiconductor element is formed, being constituted by said epitaxial layer;
   a doped layer, of the first type of conductivity, interposed between the buried layer and the epitaxial layer, the doped layer of the first type of conductivity having a bottom surface adjacent the buried layer and an upper surface opposite the bottom surface, and having sides extending from the upper surface thereof to the bottom surface, the doped layer including first and second portions, the first portion being covered by the epitaxial layer, and the second portion not being covered by the epitaxial layer;

an insulator region which extends the length of the sides of said epitaxial layer of the second type of conductivity, surrounding said epitaxial layer, the insulator region having a bottom surface closest to the substrate and an upper surface opposite the bottom surface, and sides extending between the bottom and upper surfaces, with the insulator region, together with the buried layer and doped layer, being positioned so as to shield said active region from the semiconductor substrate such that any electrons produced in the semiconductor substrate by α-particles are prevented from infiltrating into the active region;

a further semiconductor layer, of the second type of conductivity, provided on the substrate and contacting the buried layer, so that electrical contact to the buried layer can be provided; and at least one semiconductor element formed in said active region constituted by the epitaxial layer.

2. A semiconductor device according to claim 1, wherein said first type of conductivity is the p-type and said second type of conductivity is the n-type.

3. A semiconductor device according to claim 1, wherein said element is at least one selected from the group consisting of a bipolar transistor, a diode a MOS transistor, a resistor and a capacitor.

4. A semiconductor device according to claim 3, wherein the semiconductor element is the bipolar transistor, and said bipolar transistor has a lateral pnp structure.

5. A semiconductor device according to claim 3, wherein the semiconductor element is the diode, and said diode is a Schottky barrier diode.

6. A semiconductor device according to claim 1, wherein a memory device is formed in said active region layer of the second type of conductivity.

7. A semiconductor device according to claim 1, wherein said first portion of the doped layer of the first type of conductivity has a thickness greater than 0.4 $\mu$m and an impurity concentration greater than $1 \times 10^{17} cm^{-3}$.

8. A semiconductor device according to claim 1, further comprising electrical connection means for contacting said at least one element.

9. A semiconductor device according to claim 3, further comprising electrical connection means for contacting said at least one element.

10. A semiconductor device according to claim 1, wherein said insulator region extends the length of the sides of the doped layer of the first type of conductivity, surrounding said doped layer, in addition to extending the length of the sides of said epitaxial layer.

11. A semiconductor device according to claim 1, further comprising means for applying a voltage to said buried layer, via said further semiconductor layer, so as to form a depletion layer at a surface of the buried layer and prevent infiltration of electrons through said buried layer into said active region.

12. A semiconductor device according to claim 11, wherein said means for applying a voltage to said buried layer is a means for applying a reversely biasing voltage across said buried layer and said doped layer of the first type of conductivity, said means for applying a reversely biasing voltage including means for contacting said doped layer of the first type of conductivity, the means for contacting said doped layer being electrically connected to the second portion of the doped layer, and means for contacting the further semiconductor layer, of the second type of conductivity, said further semiconductor layer being electrically insulated from said active region and said second portion of the doped layer.

13. A semiconductor device according to claim 12, wherein said second portion of the doped layer is a doped region of the first type of conductivity provided adjacent one of the sides of said epitaxial layer, said doped region of the first type of conductivity extending to be in electrical contact with a side of said first portion of said doped layer of the first type of conductivity, the means for contacting said doped layer including a polycrystalline silicon layer having a low resistivity in contact with said doped region of the first type of conductivity, said polycrystalline silicon layer extending between said doped region of the first type of conductivity and the insulator region surrounding the sides of said epitaxial layer, and wherein the voltage is applied to said first portion of the doped layer of the first type of conductivity via said doped region of the first type of conductivity and said polycrystalline silicon layer having a low resistivity.

14. A semiconductor device according to claim 13, wherein said first type of conductivity is the p-type and said second type of conductivity is the n-type.

15. A semiconductor device according to claim 13, wherein said element is at least one selected from the group consisting of a bipolar transistor, a diode a MOS transistor, a resistor and a capacitor.

16. A semiconductor device according to claim 15, wherein said element is the bipolar transistor, and said bipolar transistor has a lateral pnp structure.

17. A semiconductor device according to claim 15, wherein said element is the diode, and said diode is a Schottky barrier diode.

18. A semiconductor device according to claim 13, wherein a memory device is formed in said active region.

19. A semiconductor device according to claim 13, wherein the insulator region, the epitaxial layer, the doped region of the first conductivity type and the polycrystalline silicon layer all extend to a common planar surface.

20. A semiconductor device according to claim 11, wherein the at least one semiconductor element is provided such that all semiconductor regions thereof are provided in said active region.

21. A semiconductor device according to claim 1, wherein the at least one semiconductor element is provided such that all semiconductor regions thereof are provided in said active region.

22. A semiconductor device according to claim 11, wherein said insulator region is positioned relative to said buried layer and said doped layer such that there is no direct contact between the semiconductor substrate and the active region.

23. A semiconductor device according to claim 1, wherein said insulator region is positioned relative to said buried layer and said doped layer such that there is no direct contact between the semiconductor substrate and the active region.

24. A semiconductor device according to claim 11, wherein said insulator region extends the length of the sides of the doped layer of the first type of conductivity, surrounding said doped layer, in addition to extending the length of the sides of said epitaxial layer.

25. A semiconductor device according to claim 1, wherein said insulator region is formed of silicon oxide.

26. A semiconductor device according to claim 1, wherein peripheral portions of the buried layer do not have the doped layer thereon; and wherein the insulator region extends the length of the sides of both said epitaxial layer and said doped layer, surrounding both said epitaxial layer and said doped layer, and contacts an upper surface of the peripheral portions of the buried layer.

27. A semiconductor device according to claim 1, wherein the insulator region, in combination with the buried layer and doped layer, are positioned so as to shield all semiconductor regions of said at least one semiconductor element formed in said active region from infiltration of electrons formed in the semiconductor substrate by α-particles.

28. A semiconductor device according to claim 1, wherein said insulator region is interposed between the second portion of the doped layer and the further semiconductor layer.

29. A semiconductor device according to claim 28, wherein said second portion of the doped layer extends adjacent a side of the epitaxial layer, interposed between the epitaxial layer and the insulator region.

30. A semiconductor device according to claim 29, wherein the insulator region is adjacent the second portion of the doped layer, and the further semiconductor layer is adjacent the insulator region.

31. A semiconductor device according to claim 30, wherein the doped layer is bounded by the insulator region, the buried layer extends beyond a periphery of the insulator region, and the further semiconductor layer extends along a side of the insulator region beyond the periphery of the insulator region, so that electrical contact to the buried layer can be made outside the periphery of the insulator region.

32. A semiconductor device according to claim 30, wherein each of said buried layer and said doped layer extend so as to be underneath all of the epitaxial layer surrounded by the insulator region.

33. A semiconductor device according to claim 1, wherein each of said buried layer and said doped layer extend so as to be underneath all of the epitaxial layer surrounded by the insulator region.

34. A semiconductor device according to claim 1, wherein the doped layer is bounded by the insulator region, the buried layer extends beyond a periphery of the insulator region, and the further semiconductor layer extends along a side of the insulator region beyond the periphery of the insulator region, so that electrical contact to the buried layer can be made outside the periphery of the insulator region.

35. A semiconductor device according to claim 1, wherein the insulator region is positioned to prevent electrons produced in the semiconductor substrate by α-particles from infiltrating into the active region through the sides of the epitaxial layer, and the doped and buried layers are positioned to prevent electrons produced in the semiconductor substrate by α-particles from infiltrating into the active region through the bottom surface of the epitaxial layer.

36. A semiconductor device according to claim 1, wherein said doped layer and said buried layer form a pn-junction therebetween, said pn-junction, together with said insulator region, being positioned so as to shield said active region from the semiconductor substrate such that any electrons produced in the semiconductor substrate by α-particles are prevented from infiltrating into the active region.

37. A semiconductor device according to claim 36, wherein said pn-junction extends so as to be beneath all of the epitaxial layer surrounded by the insulator region.

38. A semiconductor device according to claim 36, wherein the insulator region is positioned to prevent electrons produced in the semiconductor substrate by α-particles from infiltrating into the active region through the sides of the epitaxial layer, and the pn-junction is positioned to prevent electrons produced in the semiconductor substrate by α-particles from infiltrating into the active region through the bottom surface of the epitaxial layer.

39. A semiconductor device according to claim 10, wherein said pn-junction extends so as to be beneath all of the epitaxial layer and doped layer surrounded by the insulator region.

* * * * *